United States Patent
Kim et al.

(10) Patent No.: US 11,028,321 B2
(45) Date of Patent: *Jun. 8, 2021

(54) ETCHING COMPOSITION, METHOD FOR ETCHING INSULATING LAYER OF SEMICONDUCTOR DEVICES AND METHOD FOR PREPARING SEMICONDUCTOR DEVICES

(71) Applicants: SK Innovation Co., Ltd., Seoul (KR); SK-Materials Co., Ltd., Yeongju-si (KR)

(72) Inventors: Cheol Woo Kim, Daejeon (KR); Yu Na Shim, Daejeon (KR); Kwang Kuk Lee, Daejeon (KR); Jae Hoon Kwak, Yeongju-si (KR); Young Bom Kim, Yeongju-si (KR); Jong Ho Lee, Yeongju-si (KR); Jin Kyung Jo, Yeongju-si (KR)

(73) Assignees: SK Innovation Co., Ltd., Seoul (KR); SK-Materials Co., Ltd., Yeongju-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/594,491

(22) Filed: Oct. 7, 2019

(65) Prior Publication Data
US 2020/0131439 A1 Apr. 30, 2020

(30) Foreign Application Priority Data
Oct. 26, 2018 (KR) ........................ 10-2018-0128939

(51) Int. Cl.
*C09K 13/06* (2006.01)
*H01L 21/311* (2006.01)
*C23F 1/10* (2006.01)

(52) U.S. Cl.
CPC ........ *C09K 13/06* (2013.01); *H01L 21/31111* (2013.01); *C23F 1/10* (2013.01)

(58) Field of Classification Search
CPC ........ C09K 13/06; C09K 13/00; C09K 13/04; C09K 3/04; C09K 3/00; H01L 21/31111; C23F 1/10; C09G 1/00
(Continued)

(56) References Cited

U.S. PATENT DOCUMENTS

2016/0017224 A1* 1/2016 Lee ..................... H01L 21/0214
438/706
2017/0285477 A1* 10/2017 Tanigaki ............... G03F 7/0047

FOREIGN PATENT DOCUMENTS

JP 5003057 B2 8/2012
KR 10-1539373 B1 7/2015
(Continued)

*Primary Examiner* — Lan Vinh
(74) *Attorney, Agent, or Firm* — Oblon, McClelland, Maier & Neustadt, L.L.P.

(57) ABSTRACT

An etching composition is provided. The etching composition includes phosphoric acid, phosphoric anhydride, a silane compound represented by Formula 1 below and water:

[Formula 1]

(Continued)

wherein $R^1$ to $R^6$ are independently hydrogen, halogen, a substituted or unsubstituted $C_1$-$C_{20}$ hydrocarbyl group, a $C_1$-$C_{20}$ alkoxy group, a carboxy group, a carbonyl group, a nitro group, a tri($C_1$-$C_{20}$-alkyl)silyl group, a phosphoryl group, or a cyano group. L is a direct bond or $C_1$ to $C_3$ hydrocarbylene, and A is an n-valent radical, while n is an integer of 1 to 4.

20 Claims, 1 Drawing Sheet

(58) Field of Classification Search
USPC .................. 252/79.1, 79.2, 79.3; 438/745
See application file for complete search history.

(56) References Cited

FOREIGN PATENT DOCUMENTS

| | | |
|---|---|---|
| KR | 10-1539374 B1 | 7/2015 |
| KR | 10-1539375 B1 | 7/2015 |
| KR | 10-2017-0066179 A | 6/2017 |
| KR | 10-2017-0066180 A | 6/2017 |
| KR | 10-2017-0066183 A | 6/2017 |
| KR | 10-2017-0066184 A | 6/2017 |

\* cited by examiner

ETCHING COMPOSITION, METHOD FOR ETCHING INSULATING LAYER OF SEMICONDUCTOR DEVICES AND METHOD FOR PREPARING SEMICONDUCTOR DEVICES

CROSS-REFERENCE TO RELATED APPLICATION(S)

This application claims benefit of priority to Korean Patent Application No. 10-2018-0128939 filed on Oct. 26, 2018 in the Korean Intellectual Property Office, the disclosure of which is incorporated herein by reference in its entirety.

BACKGROUND

1. Field

The present disclosure relates to an etching composition, and particularly, to an etching composition having a high selection ratio which may selectively remove a nitride film while minimizing an etching rate of an oxide film.

2. Description of Related Art

An oxide film, such as a silicon oxide ($SiO_2$) film, and a nitride film, such as a silicon nitride (SiNx) film, are representative insulator films, and in a semiconductor manufacturing process, the silicon oxide film or the silicon nitride film is used alone or in the form of a laminate in which one or more films are alternately stacked. In addition, the oxide film or the nitride film is also used as a hard mask for forming a conductive pattern such as a metal wiring.

In a wet etching process for removing the nitride film, a mixture of phosphoric acid and deionized water is generally used. The deionized water is added for preventing a decrease in an etching rate and a change in etching selective of the nitride film to the oxide film; however, there may be a problem in that defects may arise in a nitride film etching removal process even with a minute change in an amount of supplied deionized water. In addition, phosphoric acid is a strong acid and is corrosive, thereby having difficulties in handling.

In order to solve these problems, there was a conventionally known technology for removing a nitride film using an etching composition including fluoric acid (HF), nitric acid ($HNO_3$), or the like in phosphoric acid ($H_3PO_4$), but resulted in inhibiting an etching selection ratio of the nitride film and the oxide film. In addition, there is also a known technology of using an etching composition including phosphoric acid and a silicate or silicic acid; however, the silicic acid or silicate has a problem of causing particles which may affect a substrate, thereby being somewhat inappropriate for a semiconductor manufacturing process.

However, when phosphoric acid is used in a wet etching process for removing the nitride film, not only the nitride film but also an SOD oxide film is etched due to a reduced etching selection ratio between the nitride film and the oxide film, whereby it is difficult to adjust an effective field oxide height (EFH). Accordingly, a sufficient wet etching time for removing the nitride film may not be secured, or an additional process is needed, which causes a change and has a negative influence on device characteristics.

Therefore, an etching composition having a high selection ratio, which selectively etches a nitride film to an oxide film and does not have a problem such as particle occurrence in a semiconductor manufacturing process, is currently demanded.

Meanwhile, a silane-based additive, an additive added to a conventional etching solution composition, has low, inadequate solubility, thereby causing precipitation of particles and abnormal growth of the substrate in the etching solution composition. Such particles may remain on the silicon substrate, resulting in defects of the device implemented thereon, or equipment used in a washing process, resulting in equipment failure.

Further, long-term storage changes etching rates of the nitride film or the silicon oxide film, thereby changing selectivity.

SUMMARY

An aspect of the present disclosure may provide an etching composition having a high selection ratio, which may selectively remove a nitride film while minimizing an etching rate of an oxide film, and does not have problems such as particle occurrence having a bad influence on device characteristics, and a silane compound used in the etching composition.

Another aspect is to provide an etching composition having excellent storage stability.

According to an aspect of the present disclosure, an etching composition may include phosphoric acid, phosphoric anhydride, a silane compound represented by the following Formula 1 and water:

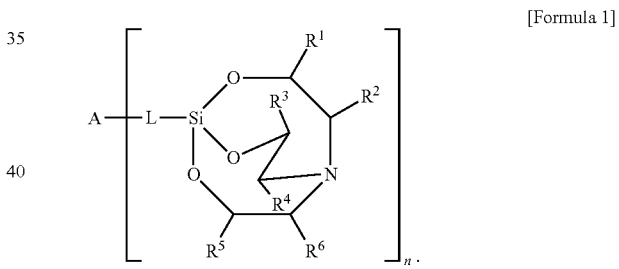

[Formula 1]

In Formula 1, $R^1$ to $R^6$ are independently hydrogen, halogen, a substituted or unsubstituted $C_1$-$C_{20}$ hydrocarbyl group, a $C_1$-$C_{20}$ alkoxy group, a carboxy group, a carbonyl group, a nitro group, a tri($C_1$-$C_{20}$-alkyl)silyl group, a phosphoryl group, or a cyano group. L is a direct bond or $C_1$-$C_3$ hydrocarbylene, and A is an n-valent radical, while n is an integer of 1 to 4.

The substituted or unsubstituted $C_1$-$C_{20}$ hydrocarbyl group may be a substituted or unsubstituted $C_1$-$C_{20}$ alkyl group or a substituted or unsubstituted $C_6$-$C_{20}$ aryl group, and the substituted $C_1$-$C_{20}$ hydrocarbyl group may be substituted with halogen.

A may be hydrocarbyl, hydrocarbylene, a radical having N as a binding site, a radical having O as a binding site, a radical having S as a binding site or a radical having P as a binding site.

The hydrocarbyl may be $C_1$-$C_{20}$ alkyl, $C_2$-$C_{20}$ alkenyl, or $C_6$-$C_{20}$ aryl.

The radical having N as a binding site may be *—$NR^{11}R^{12}$, *—$NR^{13}$—*, *—$NR^{14}CONR^{15}$—*, *—$NR^{16}CSNR^7$—*, or,

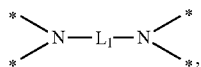

where $R^{11}$ and $R^{12}$ are independently hydrogen, $C_1$-$C_{20}$ alkyl, $C_1$-$C_{20}$ aminoalkyl or $CONH_2$, and $R^{13}$ to $R^{17}$ are independently hydrogen or $C_1$-$C_{20}$ alkyl, while $L_1$ is $C_1$-$C_{20}$ alkylene.

The radical having S as a binding site may be *—S—*, *—S—S—*, or

The radical having P as a binding site may be

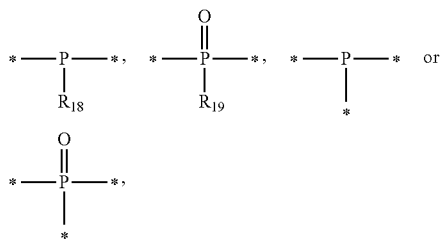

where $R^{18}$ and $R^{19}$ are independently hydrogen, $C_1$-$C_{20}$ alkyl, $C_6$-$C_{20}$ aryl, or $(C_1$-$C_{20})$alkyl$(C_1$-$C_{20})$alkoxy.

The etching composition may have Formula 1 wherein n is 1, L is a direct bond or $C_1$-$C_3$ alkylene, A is a substituted or unsubstituted $C_1$-$C_{20}$ alkyl, a substituted or unsubstituted $C_1$-$C_{20}$ alkenyl, *—$NH_2$, *—NH—$(CH_2)_l$—$NH_2$, *—NH—CO—$NH_2$, or *—$(CH_2)_m$—$C_6H_5$, and l and m are independently an integer of 0 to 10.

The etching composition may have Formula 1 wherein n is 2, L is a direct bond or $C_1$-$C_3$ alkylene, A is $C_1$-$C_{20}$ alkylene, *—$NR^{13}$—*, *—$NR^{14}$—CO—$NR^{15}$—*, *—S—*, *—S—S—*,

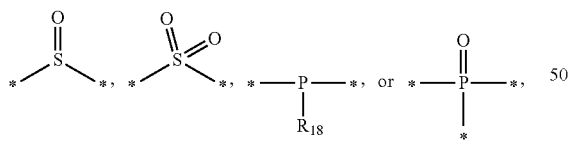

and $R^{13}$ to $R^{15}$, $R^{18}$ or $R^{19}$ are independently hydrogen, $C_1$-$C_{20}$ alkyl, $C_6$-$C_{20}$ aryl, or $(C_1$-$C_{20})$alkyl$(C_1$-$C_{20})$alkoxy.

The etching composition may have Formula 1 wherein n is 3, L is a direct bond or $C_1$-$C_3$ alkylene, and A is

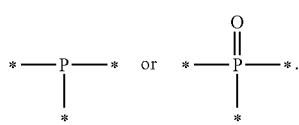

The etching composition may have Formula 1 wherein n is 4, L is $C_1$-$C_3$ alkylene, and A is

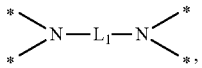

where $L_1$ is $C_1$-$C_{10}$ alkylene.

In Formula 2, $R^1$ to $R^6$ may be hydrogen; $R^1$ may be substituted or unsubstituted hydrocarbyl, and $R^2$ to $R^6$ may be hydrogen.

The silane compound may be selected from the following structures:

(1)
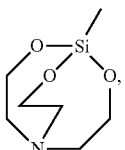

(2)
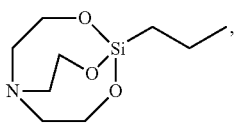

(3)
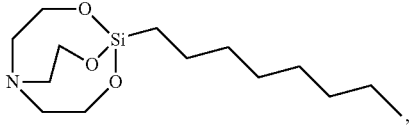

(4)
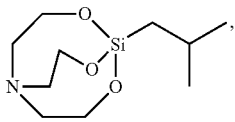

(5)
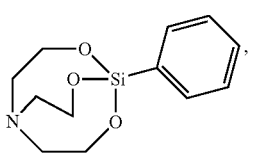

(6)
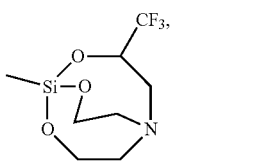

(7)
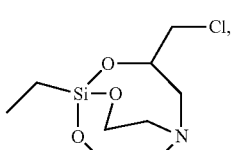

(8)
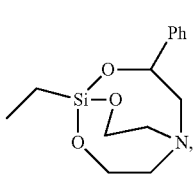

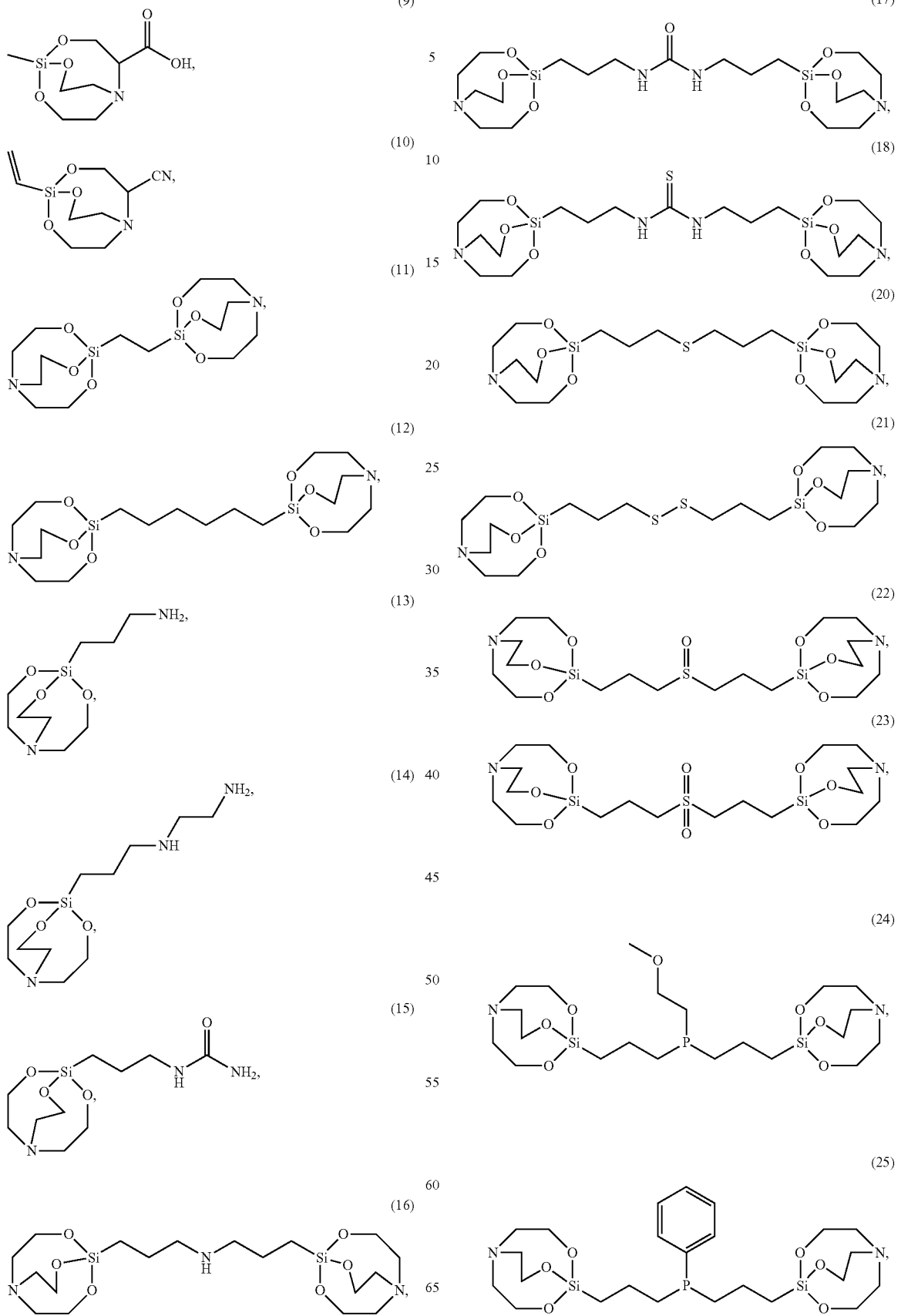

(26)

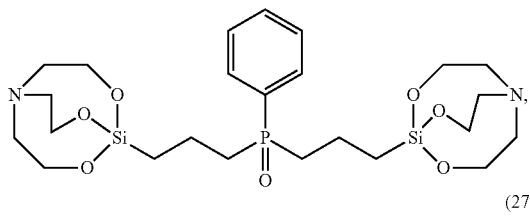

(27)

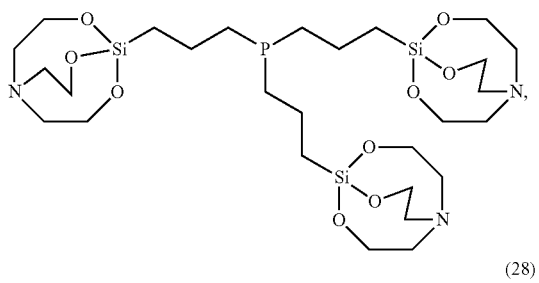

(28)

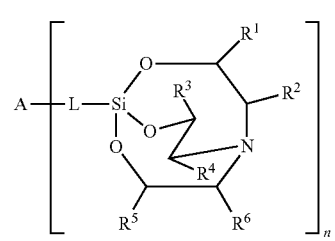

As for the phosphoric anhydride, water-removed phosphoric anhydride can be used. For example, the phosphoric anhydride may be at least one selected from the group consisting of pure phosphoric acid, pyrophosphoric acid, polyphosphoric acid having at least 3Ps and metaphosphoric acid.

The etching composition may include 70 wt % to 95 wt % phosphoric acid, 1 wt % to 20 wt % phosphoric anhydride, 0.001 wt % to 5 wt % silane compound, and a remainder of water.

The etching composition may further include a silane compound represented by the following Formula 2:

[Formula 2]

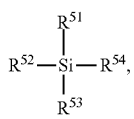

wherein $R^{51}$ to $R^{54}$ are independently hydrogen, hydrocarbyl, or heterohydrocarbyl, and $R^{51}$ to $R^{54}$ individually exist or two or more thereof form a ring, connected by a heteroelement.

The etching composition may further include an ammonium salt.

According to another aspect of the present disclosure, a method of etching an insulating film using the etching composition is provided.

According to another aspect of the present disclosure, a method of manufacturing a semiconductor device including the method of etching an insulating film is provided.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
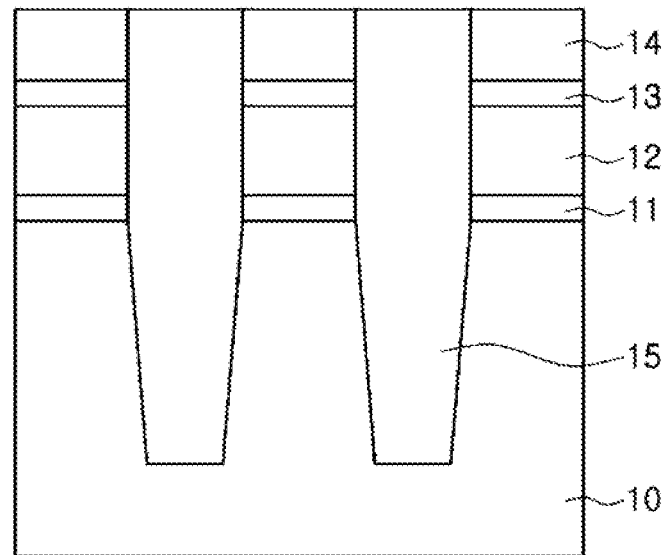
FIGS. 1 and 2 are process sectional views showing a device separation process of a flash memory device.

The present disclosure is to provide an etching composition having a high selection ratio enabling selective removal of a nitride film while minimizing an etching rate of an oxide film and also having excellent storage stability.

The etching composition of the present disclosure includes phosphoric acid, phosphoric anhydride, a silane compound and water.

The phosphoric acid is for etching a nitride through a reaction with silicon nitride. The phosphoric acid etches a silicon nitride by reacting as shown in formula (1) below:

$$3Si_3N_4 + 27H_2O + 4H_3PO_4 \rightarrow 4(NH_4)_3PO_4 + 9SiO_2H_2O \quad (1)$$

The phosphoric acid may be, for example, an aqueous phosphoric acid solution containing phosphoric acid in a concentration of 80%. Water used in the aqueous phosphoric acid solution is not particularly limited, but is preferably deionized water.

It is preferable that the phosphoric acid be contained in an amount of 70 wt % to 95 wt % based on the total weight of the etching composition. In the case of being contained in an amount of less than 70 wt %, a nitride film is not easily removed, whereas in the case of being contained in an amount greater than 95 wt %, a high selection ratio cannot be obtained for the nitride film.

The silane compound represented by the following Formula 1 can be used:

[Formula 1]

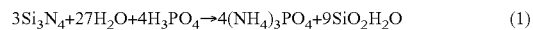

In Formula 1, $R^1$ to $R^6$ may be independently hydrogen, halogen, a substituted or unsubstituted $C_1$-$C_{20}$ hydrocarbyl group, a $C_1$-$C_{20}$ alkoxy group, a carboxy group, a carbonyl group, a nitro group, a tri ($C_1$-$C_{20}$-alkyl)silyl group, a phosphoryl group, or a cyano group. More preferably, in Formula 1, $R^1$ to $R^6$ may be hydrogen, and alternatively, $R^1$ may be a substituted or unsubstituted $C_1$-$C_{20}$ hydrocarbyl and $R^2$ to $R^6$ may be hydrogen.

The substituted or unsubstituted $C_1$-$C_{20}$ hydrocarbyl group may be a substituted or unsubstituted $C_1$-$C_{20}$ alkyl group or a substituted or unsubstituted $C_6$-$C_{20}$ aryl group, wherein the substituted hydrocarbyl group may be a hydrocarbyl group substituted with halogen such as alkyl halide.

L may be a direct bond or $C_1$-$C_3$ hydrocarbylene, more specifically $C_1$-$C_3$ alkylene.

A represents an n-valent radical wherein n is an integer of 1 to 4. For example, A may be hydrocarbyl, hydrocarbylene, a radical having N as a binding site, a radical having S as a binding site, a radical having O as a binding site, a radical having P as a binding site, or the like.

For example, the hydrocabyl may be substituted or unsubstituted $C_1$-$C_{20}$ alkyl, $C_2$-$C_{20}$ alkenyl, or $C_6$-$C_{20}$ aryl, and more specifically, for example, —$CH_3$, —$(CH_2)_3$, —$(CH_2)_2CH_3$, —$(CH_2)_7CH_3$, —$CH_2CH(CH_3)_2$, $CHCH_2$, phenyl, or the like, where n is an integer of 1. Further, the hydrocarbylene is the case in which n is 2, and may be $C_2$-$C_{20}$ alkylene such as $(CH_2)_2$.

A is a radical having N as a binding site when n is 1; for example, A may be *—$NR_{11}R_{12}$ such as unsubstituted amine such as *—$NH_2$ or substituted amine such as *—NH $(CH_2)_2NH_2$ or $NHCONH_2$, or the like. In addition, A is a radical having N as a binding site when n is 2, and may be *—$NR_{13}$—* such as *—NH—*, *—$NR_{14}CONR_{15}$—* such as *—NHCONH—*, *—$NR_{16}CSNR_{17}$—* such as *—NHCSNH—*, or the like. Further, when n is 4, A may be

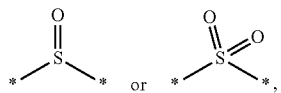

In this case, $R^{11}$ and $R^{12}$ may be independently hydrogen, $C_1$-$C_{20}$ alkyl, $C_1$-$C_{20}$ aminoalkyl, $CONH_2$, or the like, and $R^{13}$ to $R^{17}$ may be independently hydrogen or $C_1$-$C_{20}$ alkyl. $L_1$ may be $C_1$-$C_{20}$ alkylene.

The radical having S as a binding site may be for example, *—S—*, *—S—S—*,

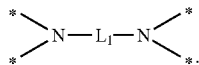

and in this case, n is an integer of 2.

Meanwhile, the radical having P as a binding site may be for example,

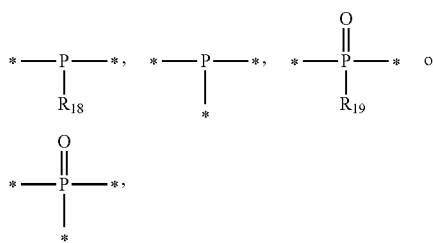

and in this case, n is an integer of 2 or 3. In this case, $R^8$ and $R^9$ are independently hydrogen, $C_1$-$C_{20}$ alkyl, $C_6$-$C_{20}$ aryl or $(C_1$-$C_{20})$alkyl$(C_1$-$C_{20})$alkoxy.

In the present disclosure, the silane compound of Formula 1, wherein n is 1 is, for example, a silane compound wherein L is a direct bond or $C_1$-$C_3$ alkylene, A is substituted or unsubstituted $C_1$-$C_{20}$ alkyl, *—$NH_2$, *—NH— $(CH_2)_1$—$NH_2$, *—NH—CO—$NH_2$, *—$C_6H_5$, or *—$(CH_2)_m$—$C_6H_5$, and l and m is independently an integer of 1 to 10.

In addition, the silane compound of Formula 1 wherein n is 2 may be a silane compound wherein L is a direct bond or $C_1$-$C_3$ alkylene, and A is $C_1$-$C_{20}$ alkylene, *—NH—* or *—C(O)—*.

Further, the silane compound of Formula 1 wherein n is 4 may be a silane compound wherein A is

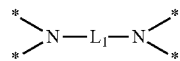

where $L_1$ is $C_1$-$C_{10}$ alkylene.

The silane compound represented by Formula 1 may be, more specifically for example, a silane compound represented by following Structural Formulae 1 to 28:

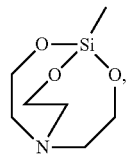
(1)

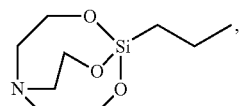
(2)

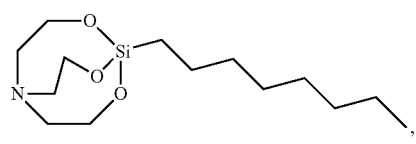
(3)

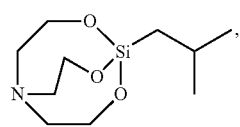
(4)

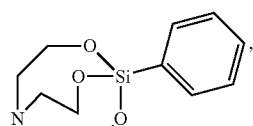
(5)

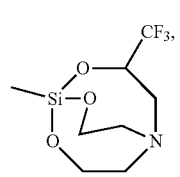
(6)

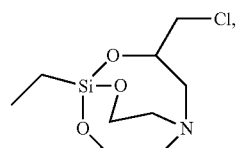
(7)

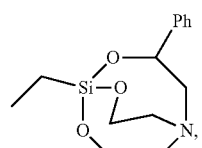
(8)

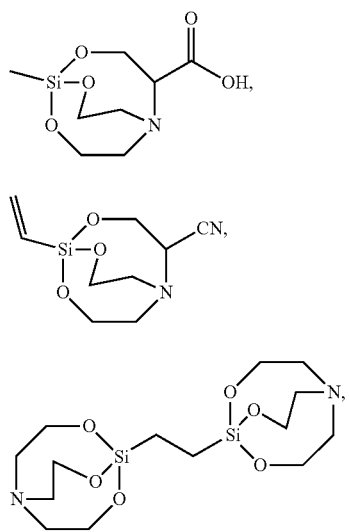

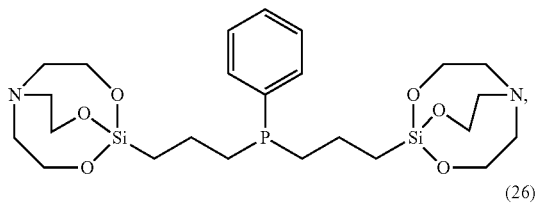

(25)

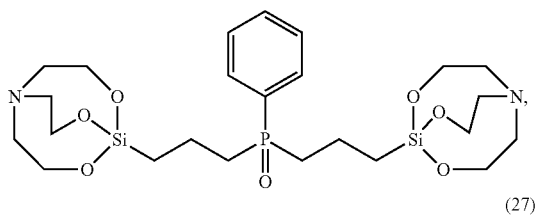

(26)

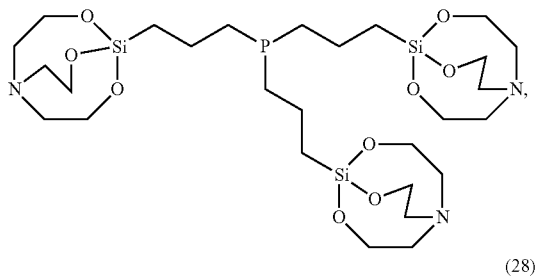

(27)

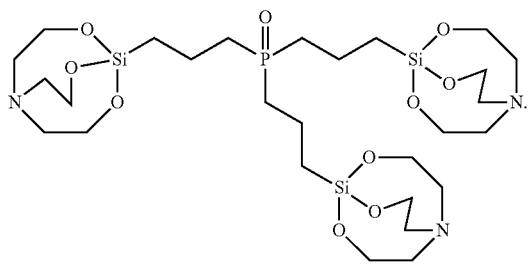

(28)

Oxygens included in the silane compound are bonded to a surface of the oxide film to protect the oxide film, and may be hydrogen-bonded to the surface of the oxide film, thereby minimizing etching of the oxide film during etching of the nitride in the etching composition.

In addition, the silane compound as above is a cyclic silane compound and may be present in the etching composition in a most stable form, and thus may significantly increase an etching selection ratio as compared with a short chain silicon additive which has conventionally been used. Furthermore, structural stability of an active silicon-based additive in the etching composition is improved by including such cyclic compound, thereby enabling continuous maintaining of the etching rate of the silicon oxide film.

The silane compound of the present disclosure may be added in an amount of 0.001 wt % to 5 wt %, based on the total weight of the etching composition. The silane compound suggested in the present disclosure can effectively be a silicone oxide film, even when a small amount thereof is added to the etching composition, thereby increasing etching selectivity of the nitride to the oxide film. When the silane compound is used in an amount of less than 0.001 wt %, it is difficult to obtain high selectivity of the nitride film to the oxide film, whereas when the use amount is more than 1 wt %, the silane compound may be gelled when the silane compound is used in an amount greater than 5 wt %, which is not preferable. For example, the amount of the silane additive may be 0.001 wt % to 3 wt %, 0.002 wt % to 2 wt %, 0.005 wt % to 1 wt %, 0.005 wt % to 0.5 wt %, or the like.

The silane compound used as an additive for the etching compound is featured in low solubility. If a silane-based additive whose proper solubility is not ensured in the etching composition is used or if a compositional ratio is not adjusted to an appropriate level, silicon-based particles are precipitated and abnormal growth is caused in the etching composition. Such particles may remain in the silicon substrate and cause defects in devices implemented on the substrate or in equipment (e.g., a filter) used in the etching or washing and thus, may cause equipment failure.

In this regard, the present disclosure uses phosphoric anhydride along with the silane compound represented by Formula 1 above. Although not particularly limited, phosphoric acid, from which water is completely removed, may be used for the phosphoric anhydride. The phosphoric anhydride can be any one of pure phosphoric acid, pyrophsphoric acid, polyphosphoric acid having at least 3Ps and metaphosphoric acid. These may be used alone or in a combination of two or more.

The phosphoric anhydride can be obtained by heating phosphoric acid at a temperature of 180° C. to 220° C. to remove water therefrom. In the present disclosure, use of the phosphoric anhydride along with the silane compound of Formula 1 can prevent precipitation of the silane-based additives, which have not been dissolved, due to hydrolysis and polycondensation caused by a remainder of water.

For example, in the case in which a hydrophilic functional group is linked to a silicon atom as the silane compound of Formula 1 above, the silane compound reacts with water and is substituted with a hydroxyl group to form a silicon-hydroxyl group (—Si—OH). Such silicon-hydroxyl group produces a siloxane group (—Si—O—Si—) by polymerization, resulting in abnormal growth and precipitation of the silicon-based particles.

It is preferable that the phosphoric anhydride be included in an amount of 1 wt % to 20 wt %. In the case of being included in an amount less than 1 wt %, the silane-based additives are not dissolved and precipitated, whereas in the case of being included in an amount exceeding 20 wt %, a high selection ratio cannot be obtained for the silicon nitride film.

It is preferable that the phosphoric anhydride and the silane compound of Formula 1 be first mixed, followed by adding the mixture to the phosphoric acid solution. To this end, the silane compound of Formula 1 above is added to the phosphoric anhydride and dissolved by heating at a temperature of 30° C. to 300° C. to mix.

The etching composition of the present disclosure can prevent particle production and have improved storage stability by adding phosphoric anhydride to prevent silica production while preventing etching of an oxide by the silane compound represented by Formula 1 above to improve selectivity to nitride.

Meanwhile, in the above Formula 1, $SiO_2H_2O$ may be conventionally precipitated on a surface of the oxide film and cause abnormal growth, increasing a thickness of the oxide film. In particular, when the etching of the nitride is accumulated in the etching composition, a concentration of $SiO_2H_2O$ in the etching composition may increase, which may increase the incidence of abnormal growth. That is, abnormal growth caused by $SiO_2H_2O$ may not occur in an initial etching composition; however, as a number of the accumulation process increases, incidence of the abnormal growth increases. When the silane compound according to the present disclosure is included, however, such abnormal growth can be prevented.

A remainder in the silane compound of the present disclosure is a solvent. The solvent is not particularly limited, but may be water. The water may be added, for example, in an amount of 3 wt % to 28 wt %.

The etching composition of the present disclosure may further include a silane compound represented by following Formula 2:

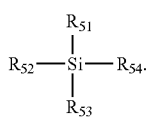

[Formula 2]

In Formula 2 above, $R^{51}$ to $R^{54}$ are independently hydrogen, hydrocarbyl, or heterohydrocarbyl, and $R^{51}$ to $R^{54}$ individually exist or two or more thereof form a ring, connected by a heteroelement. For example, $R^{51}$ to $R^{54}$ may be hydrogen, $C_1$-$C_{20}$ alkyl, $C_1$-$C_{20}$ heteroalkyl, or the like. The heteroelement is not particularly limited, but may be, for example, nitrogen (N), sulfur (S), oxygen (O), phosphorous (P), or the like.

The silane compound represented by Formula 2 may be included in an amount of 0.005 wt % to 1 wt %, based on the total weight of the etching composition.

Further, an ammonium salt may also be added to the etching composition of the present disclosure. The ammonium salt can prevent gelation of the etching composition, and may be added in an amount of 0.001 wt % to 10 wt %, based on the total weight. When less than 0.001 wt % of the ammonium salt is added, a physical property improvement of decreased gelation is insignificant. When added in an amount of more than 10 wt %, the ammonium salt may cause the gelation.

The ammonium salt is a compound having an ammonium ion, and those conventionally used in the art may be appropriately used in the present disclosure as well. Although not particularly limited, the ammonium salt may be, for example, ammonia water, ammonium chloride, ammonium acetate, ammonium phosphate, ammonium peroxydisulfate, ammonium sulfate, ammonium fluorate, or the like. These may be used alone or in a combination of two or more.

Furthermore, the etching composition of the present disclosure may further include an optional additive conventionally used in the art to further improve etching performance. The additive may be a surfactant, a metal ion sequestrant, a corrosion inhibitor, or the like.

The etching composition of the present disclosure is used for selective removal of a nitride film by etching from a semiconductor device including an oxide film and a nitride film. The nitride film may include a silicon nitride film, for example, a SiN film, a SiON film, or the like.

In addition, the oxide film may be at least one film selected from the group consisting of a silicon oxide film, for example, a spin on dielectric (SOD) film, a high density plasma (HDP) film, a thermal oxide film, a borophosphate silicate glass (BPSG) film, a phosphosilicate glass (PSG) film, a borosilicate glass (BSG) film, a polysilazane (PSZ) film, a fluorinated silicate glass (FSG) film, a low pressure tetraethyl orthosilicate (LPTEOS) film, a plasma enhanced tetraethyl orthosilicate (PETEOS) film, a high temperature oxide (HTO) film, a medium temperature oxide (MTO) film, an undoped silicate glass (USG) film, a spin on glass (SOG) film, an advanced planarization layer (APL) film, an atomic layer deposition (ALD) film, a plasma enhanced oxide (PE-oxide) film, an O3-tetraethyl orthosilicate (O3-TEOS) film or combinations thereof.

Figure 2:
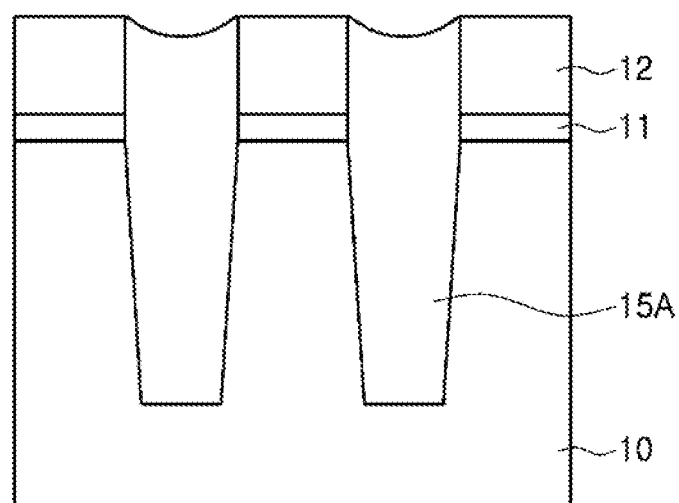

An example of an etching process using the etching composition of the present disclosure is schematized in FIGS. 1 and 2. FIGS. 1 and 2 are example process sectional views showing a device separation process of a flash memory device.

As shown in FIG. 1, a tunnel oxide film 11, a polysilicon film 12, a buffer oxide film 13, and a pad nitride film 14 are formed in turn on a substrate 10, and then the polysilicon film 12, the buffer oxide film 13 and the pad nitride film 14 are selectively etched to form a trench. Subsequently, an SOD oxide film 15 is formed until the trench is gap-filled, and a CMP process is then carried out on the SOD oxide film 15 using the pad nitride film 14 as a polishing stop film.

As shown in FIG. 2, the pad nitride film 14 is removed by wet etching using the etching composition previously described, and the buffer oxide film 13 is then removed by a washing process. As a result, a device separation film 15A is formed in a field area.

The etching process using the etching composition may be performed by a wet etching method well known in the art, for example, dipping, spraying, or the like.

A temperature of the etching process may be in a range of 50° C. to 300° C., preferably 100° C. to 200° C., more preferably 156° C. to 163° C., and an appropriate temperature may be changed, if necessary, in consideration of other processes and factors.

As such, according to a method for manufacturing a semiconductor device including the etching process carried out using the etching composition of the present disclosure, selective etching of the nitride film is feasible when the nitride film and the oxide film are alternately stacked or mixed. In addition, stability and reliability can be secured by preventing the occurrence of particles, which was problematic in the conventional etching process.

Accordingly, such method may be efficiently applied to various processes requiring selective etching of the nitride film to the oxide film in the semiconductor device-manufacturing process.

EXAMPLE

Hereinafter, the present disclosure will be described in detail by way of examples. The following Examples relate to an example of the present disclosure, but the present disclosure is not limited thereto.

Synthesis Example 1

14.9 g of triethanolamine and 20.0 mL of methyl triethoxysilane were added to a 100 mL round bottom flask, heated to 130° C. and stirred for 2 hours.

After ethanol was then removed under reduced pressure, the mixture was stirred for an additional 2 hours and cooled to room temperature. 14.4 g of a purified silane compound (1-methyl-2,8,9-trioxa-5-aza-1-silabicyclo[3.3.3]undecane; silane compound A) as shown in the following formula through toluene re-slurry (GC/FID purity 99.8%):

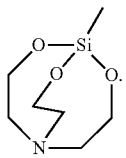

$^1$H-NMR (CDCl$_3$) 3.68 (t, J=5.5 Hz, 6H), 2.73 (t, J=5.5 Hz, 6H), −0.21 (s, 3H)

Synthesis Example 2

14.9 g of triethanolamine and 23.4 mL of aminopropyl triethoxysilane were added to a 100 mL round bottom flask, heated to 130° C. and stirred for 2 hours.

After ethanol was then removed under reduced pressure, the mixture was stirred for additional 2 hours and cooled to room temperature. 21.9 g of a purified silane compound (3-(2,8,9-trioxa-5-aza-1-silabicyclo[3.3.3]undecan-1-yl)propan-1-amine; silane compound B) as shown in the following formula through distillation under reduced pressure:

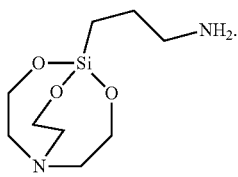 [SMILES: NCCC[Si]12OCCN(CCO1)CCO2]

$^1$H-NMR (CDCl$_3$) 3.66 (t, J=5.5 Hz, 6H), 2.71 (t, J=5.5 Hz, 6H), 2.52 (t, J=7.0 Hz, 2H), 1.42 (qui, J=9.0 Hz, 2H), 1.19 (br, 2H), 2.00 (t, J=8.5 Hz, 2H)

Synthesis Example 3

14.9 g of triethanolamine and 20.0 mL of 1-[3-(trimethoxysilyl)propyl]urea and 20 mL of toluene were added to a 100 mL round bottom flask, heated to 130° C. and stirred for 2 hours.

After ethanol was then removed under reduced pressure, the mixture was stirred for additional 2 hours and cooled to room temperature.

The thus-prepared white solid was filtered, washed with toluene and vacuum-dried to synthesize 12.4 g of a silane compound (1-(3-(2,8,9-trioxa-5-aza-1-silabicyclo[3.3.3]undecan-1-yl) propyl)urea; silane compound C) (GC/FID purity 99.5%) as shown in the following formula:

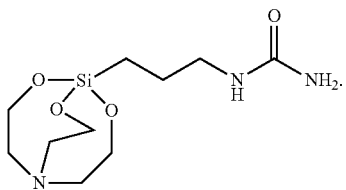 [SMILES: NC(=O)NCCC[Si]12OCCN(CCO1)CCO2]

1H-NMR (CDCl3) 3.69 (t, J=5.5 Hz, 6H), 3.39 (t, J=7.0 Hz, 2H), 2.73 (t, J=5.5 Hz, 6H), 1.47 (qui, J=9.0 Hz, 2H), 2.03 (t, J=8.5 Hz, 2H)

Synthesis Example 4

15.0 g of triethanolamine, 117.1 g of bis[3-(trimethoxysilyl)propyl]amine, 50 mL of toluene, and 0.01 g of potassium hydroxide were added to a 100 mL round bottom flask, heated to 120° C. and stirred for 2 hours.

After ethanol was then removed under reduced pressure, the mixture was stirred for an additional 2 hours and cooled to room temperature.

The thus-prepared white solid was filtered, washed with toluene, and vacuum-dried to synthesize 21 g of a silane compound bis(3-(2,8,9-trioxa-5-aza-1-silabicyclo[3.3.3]undecan-1-yl) propyl)amine: silane compound D) as shown in the following formula:

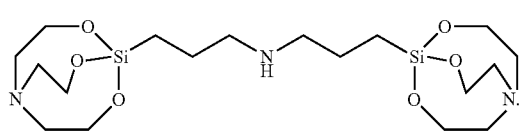

$^1$H-NMR (CDCl$_3$) 3.75 (t, J=5.5 Hz, 12H), 2.79 (t, J=5.5 Hz, 12H), 2.62 (t, J=7.0 Hz, 4H), 1.61 (qui, J=9.0 Hz, 4H), 0.40 (m, 4H)

Examples

Comparative Example 1

Aminopropyl silanetriol was added to an aqueous phosphoric acid solution as an etching additive to prepare an etching composition.

The etching composition consists of 85 wt % phosphoric acid, 0.5 wt % of the etching additive and a remainder of water as shown in Table 1.

Reference Example 1

The silane compound A obtained in Synthesis Example 1 was added to the aqueous phosphoric acid solution as an etching additive to prepare an etching composition.

The etching composition consists of 85 wt % phosphoric acid, 0.5 wt % of silane compound A, the etching additive, and a remainder of water as shown in Table 1.

Example 1

Water was completely removed by heating phosphoric anhydride at 200° C.

The silane compound A obtained in Synthesis Example 1 was added to the phosphoric anhydride, heated at 200° C. and dissolved to prepare Additive 1, a mixture of phosphoric anhydride and a silane compound.

The prepared Additive 1 was added to the phosphoric acid solution to prepare an etching composition.

The etching composition consists of 85 wt % phosphoric acid, phosphoric anhydride 10 wt %, 0.5 wt % of silane compound A and a remainder of water as shown in Table 1.

Examples 2 to 7

The silane compounds A to E obtained in Synthesis Examples 1 to 5 were used in amounts shown in Table 1 below to prepare silane compound mixtures (Additives 2 to 7) of phosphoric anhydride and a silane compound.

A content of each ingredient included in each etching composition is as shown in Table 1 below.

TABLE 1

| | Phosphoric acid | Phosphoric anhydride | Silane Compounds Types | Contents | Water |
|---|---|---|---|---|---|
| Comp. Ex. 1 | 85 wt % | — | Aminopropylsilanetriol | 0.5 wt % | 14.5 wt % |
| Ref. Ex. 1 | 85 wt % | — | Silane compound A | 0.5 wt % | 14.5 wt % |
| Example 1 | 85 wt % | 10 wt % | Silane compound A | 0.25 wt % | 4.75 wt % |
| Example 2 | 85 wt % | 10 wt % | Silane compound A | 0.5 wt % | 4.5 wt % |
| Example 3 | 85 wt % | 10 wt % | Silane compound A | 1.0 wt % | 4.0 wt % |
| Example 4 | 85 wt % | 10 wt % | Silane compound B | 0.5 wt % | 4.5 wt % |
| Example 5 | 85 wt % | 10 wt % | Silane compound C | 0.5 wt % | 4.5 wt % |
| Example 6 | 85 wt % | 10 wt % | Silane compound D | 0.5 wt % | 4.5 wt % |
| Example 7 | 85 wt % | 10 wt % | Silane compound E | 0.5 wt % | 4.5 wt % |

Experimental Example 1: Measurement of Selection Ratio

A substrate in which a silicon oxide film (SiOx) deposited at a thickness of 500 Å and a silicon nitride film (SiN) deposited at a thickness of 5000 Å were formed on a patterned silicon semiconductor wafer.

The etching compositions of Comparative Example 1, Reference Example 1 and Examples 1 to 7 were added to a round bottom flask and heated for 60 minutes to temperatures as shown in Table 2, followed by dipping the substrate for etching thereof.

The etching of the silicon semiconductor wafer was performed on the etching compositions for 720 seconds and 6000 seconds.

A surface of the patterned silicon wafer was selectively etched to measure thicknesses of a thin film of the silicon oxide film and the nitride film before and after the etching using ellipsometry, a thin film thickness-measuring apparatus (NANO VIEW, SEMG-1000). A result thereof is shown in Table 2.

A selection ratio represents a ratio of a nitride film etching rate (SiN E/R) to an oxide film etching rate (SiO E/R), and is calculated by dividing a difference between an initial thickness and a thickness after the etching by etching time (min).

TABLE 2

| | Process Temperature (° C.) | SiN E/R (Å/min) | SiO E/R (Å/min) | Selection ratio |
|---|---|---|---|---|
| Comp. Ex. 1 | 158 | 68.3 | 0.32 | 213 |
| Ref. Ex. 1 | 158 | 85.6 | 0.13 | 658 |
| Example 1 | 158 | 85.3 | 0.28 | 304 |
| Example 2 | 158 | 86.8 | 0.12 | 723 |
| Example 3 | 158 | 87.1 | 0.07 | 1245 |
| Example 4 | 158 | 87.1 | 0.11 | 792 |
| Example 5 | 158 | 87.9 | 0.09 | 977 |
| Example 6 | 158 | 91.3 | 0.06 | 1521 |
| Example 7 | 158 | 92.0 | 0.05 | 1840 |

As shown in Table 2, the etching compositions, such as Examples 1 to 7, to which etching Additives 1 to 7 in which phosphoric anhydride and a silane compound were mixed are added, showed a significantly higher etching selection ratio compared to Comparative Example 1 and Reference Example 1. Based thereon, it can be seen that the etching compositions of the Examples are excellent as an etching composition of the silicon nitride film. Further, in terms of the etching rate (SiN E/R), the etching compositions of the Examples showed a better effect compared to that of Comparative Example 1, thereby indicating that an etching composition optimized for the etching process of the silicon nitride film can be provided.

It can be understood based on such result that the Additives A to E used in the etching compositions in Reference Example 1 and Example 1 have improved active silicon-based structural stability than a short chain structure by including a cyclic compound. Use of phosphoric anhydride along therewith may facilitate prevention of undissolving and precipitation of the silane-based additives, which are caused by hydrolysis and polycondensation thereof due to the remainder of water.

As described above, it has been confirmed that an etching composition capable of improving an etching rate of a silicon nitride film, an etching selection ratio and etching stability to improve etching process efficiency.

Experimental Example 2: Measurement of Particles of Etching Composition

For the etching compositions of Comparative Example 1, Reference Example 1 and Examples 2 and 4 to 7 as shown in Table 1, particles in the solution were measured using a liquid particle counter (LPC; KS-42BF, Rion) by the following method.

Ultrapure water was added to a beaker in order to dip samples for measuring washability and set in an LPC apparatus. A number and size of particles present in the ultrapure water were measured.

From the measurement data of the ultrapure water, a number of particles having a particle diameter of at least 0.3 µm was calculated, and the calculated value was determined as a number of the particles before the etching (blank measurement value).

The etched silicon semiconductor wafer obtained in Experimental Example 1 was then dipped in a beaker containing the ultrapure water.

Ultrasonic washing was carried out for a predetermined time to extract particles attached to a surface of each sample from the ultrapure water.

The LPC apparatus was used to measure a number and size of particles present in the ultrapure water and calculate a number of the particles having a particle diameter of at least 0.3 µm. A difference between the calculated number and the blank measurement value was determined as a number of particles extracted from the etching composition samples.

When measuring distribution of the particle number and size, the same composition was measured three times with the LPC apparatus to obtain a value. An average of the three values was determined as the particle number.

Furthermore, the particle size was counted considering particles having a particle size in the range of 0.1 µm to 1 µm as effective particles. Particles having a particle size of 0.2 µm or less and whose number is 300 particles/cm$^2$ or less were evaluated as being fine.

The measurement result is shown in Table 3.

TABLE 3

| Classification | Particle size (μm) | Particle number (ea/cm²) | Result |
|---|---|---|---|
| Comp. Ex. 1 | 0.86 | 1368 | Poor |
| Ref. Ex. 1 | 0.54 | 232 | Poor |
| Example 2 | 0.20 | 201 | Fine |
| Example 4 | 0.11 | 154 | Fine |
| Example 5 | 0.20 | 59 | Fine |
| Example 6 | 0.19 | 45 | Fine |
| Example 7 | 0.13 | 103 | Fine |

Based on Table 2 above, it was evaluated that the etching composition of Comparative Example 1 has poor particle size and number, and that of Reference Example 1 has a poor particle size. In contrast, the etching compositions of Examples 2 and 4 to 7 were shown to have fine particle sizes and numbers.

The form of a silane compound, as the silane-based additives of Comparative Example 1 and Reference Example 1, in which a hydrophilic functional group is linked to the silicon atom, reacts with water and is substituted a hydroxyl group to form a silicon-hydroxyl group (—Si—OH). Such silicon-hydroxyl group produces a siloxane group (—Si—O—Si—) by polymerization, resulting in abnormal growth and precipitation of the silicon-based particles.

In contrast, it seems that the etching composition, to which phosphoric anhydride and the silane-based additive of Examples 2 and 4 to 7 are added, is unlikely to react with water and hydroxylated to produce siloxane, thereby serving to prevent of particle growth. In this regard, it is considered that the etching composition will be effectively applied to the manufacturing of a semiconductor device requiring selective etching of a silicon nitride film by securing long-term stability and reliability of the process.

Experimental Example 3: Observation of Change of Etching Composition Over Time (Storage Stability)

The etching compositions of Comparative Example 1 and Examples 5 were stored for a predetermined time at 70° C. An etching test was performed again for each etching composition every 7 days under the same condition as that of Experimental Example 1. A result thereof is shown in Table 4 below.

TABLE 4

| Classification | Period of storage | SiN E/R (Å/min) | SiO E/R (Å/min) | Selection ratio |
|---|---|---|---|---|
| Comp. Ex. 1 | — | 68.3 | 0.32 | 213 |
|  | 7 days | 68.0 | 0.35 | 194 |
|  | 14 days | 67.8 | 0.40 | 169 |
|  | 21 days | 66.5 | 0.58 | 114 |
| Example 5 | — | 91.3 | 0.060 | 1521 |
|  | 7 days | 91.2 | 0.060 | 1520 |
|  | 14 days | 91.2 | 0.061 | 1495 |
|  | 21 days | 91.4 | 0.062 | 1474 |

Based on Table 4, the etching composition of Comparative Example has not only a low selection ratio but also a significantly reduced etching rate (SIN E/R, SiO E/R) after 21 days, thereby indicating that the selection ratio is not easily maintained. In contrast, the selection ratio of Example 4 rarely changed, thereby indicating an excellent effect in terms of storage stability.

The etching composition according to the present disclosure has a high etching selection ratio of a nitride film to an oxide film by including a silane compound producing a protective film capable of protecting the oxide film by reacting with a surface of the oxide film.

In addition, use of the etching composition of the present disclosure prevents particle generation and deterioration of electrical characteristics caused by the etching of the oxide film or damage on a film of the oxide film when removing the nitride film, thereby improving device characteristics.

Furthermore, the etching composition of the present disclosure has excellent storage stability and can thus prevent deterioration of etching performance of the etching composition.

While exemplary embodiments have been shown and described above, it will be apparent to those skilled in the art that modifications and variations could be made without departing from the scope of the present invention as defined by the appended claims.

What is claimed is:

1. An etching composition comprising:
   phosphoric acid;
   phosphoric anhydride;
   a silane compound represented by Formula 1 below; and
   water:

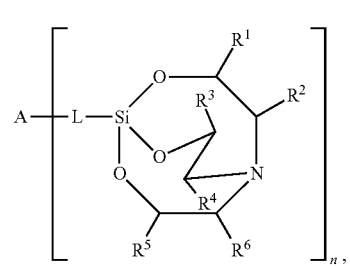

[Formula 1]

wherein
$R^1$ to $R^6$ are independently hydrogen, halogen, a substituted or unsubstituted $C_1$-$C_{20}$ hydrocarbyl group, a $C_1$-$C_{20}$ alkoxy group, a carboxy group, a carbonyl group, a nitro group, a tri ($C_1$-$C_{20}$-alkyl) silyl group, a phosphoryl group, or a cyano group,
L is a direct bond or $C_1$-$C_3$ hydrocarbylene,
A is an n-valent radical, and
n is an integer of 1 to 4.

2. The etching composition of claim 1, wherein the substituted or unsubstituted $C_1$-$C_{20}$ hydrocarbyl group is a substituted or unsubstituted $C_1$-$C_{20}$ alkyl group or a substituted or unsubstituted $C_6$-$C_{20}$ aryl group.

3. The etching composition of claim 2, wherein the substituted $C_1$-$C_{20}$ hydrocarbyl group is substituted with halogen.

4. The etching composition of claim 1, wherein A is hydrocarbyl, hydrocarbylene, a radical having N as a binding site, a radical having O as a binding site, a radical having S as a binding site or a radical having P as a binding site.

5. The etching composition of claim 4, wherein the hydrocarbyl is $C_1$-$C_{20}$ alkyl, $C_2$-$C_{20}$ alkenyl, or $C_6$-$C_{20}$ aryl.

6. The etching composition of claim 4, wherein the radical having N as a binding site is *—$NR^{11}R^{12}$, *—$NR^{13}$—*, *—$NR^{14}CONR^{15}$—*, *—$NR^{16}CSNR^{17}$—*, or

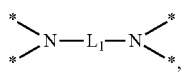

wherein $R^{11}$ and $R^{12}$ are independently hydrogen, $C_1$-$C_{20}$ alkyl, $C_1$-$C_{20}$ aminoalkyl, or $CONH_2$,
$R^{13}$ to $R^{17}$ are independently hydrogen or $C_1$-$C_{20}$ alkyl, and
$L_1$ is $C_1$-$C_{20}$ alkylene.

7. The etching composition of claim 4, wherein the radical having S as a binding site is *—S—*, *—S—S—*,

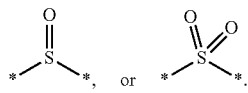

8. The etching composition of claim 4, wherein the radical having P as a binding site is

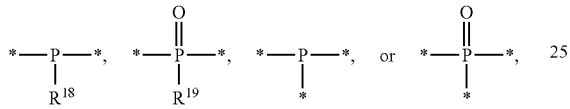

wherein $R^{18}$ and $R^{19}$ are independently hydrogen, $C_1$-$C_{20}$ alkyl, $C_6$-$C_{20}$ aryl, or $(C_1$-$C_{20})$alkyl$(C_1$-$C_{20})$alkoxy.

9. The etching composition of claim 1, wherein
n is 1,
L is the direct bond or $C_1$-$C_3$ alkylene,
A is substituted or unsubstituted $C_1$-$C_{20}$ alkyl, substituted or unsubstituted $C_1$-$C_{20}$ alkenyl, *—$NH_2$, *—NH—$(CH_2)_l$—$NH_2$, *—NH—CO—$NH_2$, or *—$(CH_2)_m$—$C_6H_5$, and
l and m are independently an integer of 0 to 10.

10. The etching composition of claim 1, wherein
n is 2,
L is a direct bond or $C_1$-$C_3$ alkylene,
A is $C_1$-$C_{20}$ alkylene, *—$NR^{13}$—*, *—$NR^{14}$—CO—$NR^{15}$—*, *—S—*, *—S—S—*,

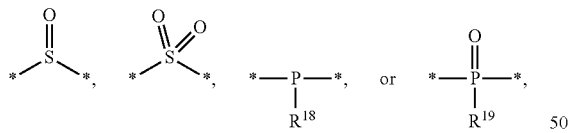

and
$R^{13}$ to $R^{15}$, $R^{18}$, and $R^{19}$ are independently hydrogen, $C_1$-$C_{20}$ alkyl, $C_6$-$C_{20}$ aryl, or $(C_1$-$C_{20})$alkyl$(C_1$-$C_{20})$alkoxy.

11. The etching composition of claim 1, wherein
n is 3,
L is a direct bond or $C_1$-$C_3$ alkylene, and
A is

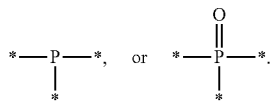

12. The etching composition of claim 1, wherein
n is 4,
L is $C_1$-$C_3$ alkylene, and
A is

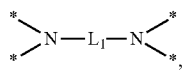

wherein $L_1$ is $C_1$-$C_{10}$ alkylene.

13. The etching composition of claim 1, wherein $R^1$ to $R^6$ are hydrogen.

14. The etching composition of claim 1, wherein $R^1$ is substituted or unsubstituted hydrocarbyl, and $R^2$ to $R^6$ are hydrogen.

15. The etching composition of claim 1, wherein the silane compound is selected from the following structures:

(1)

(2)

(3)
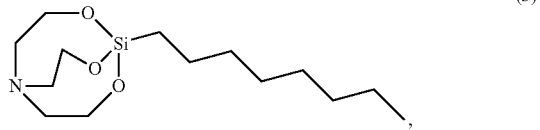

(4)

(5)
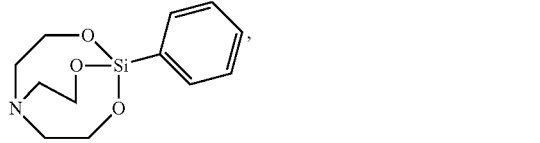

(6)

(7)
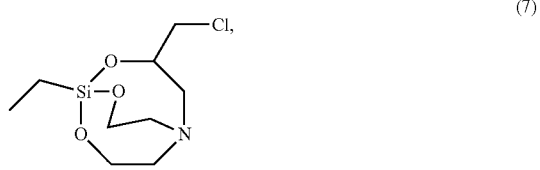

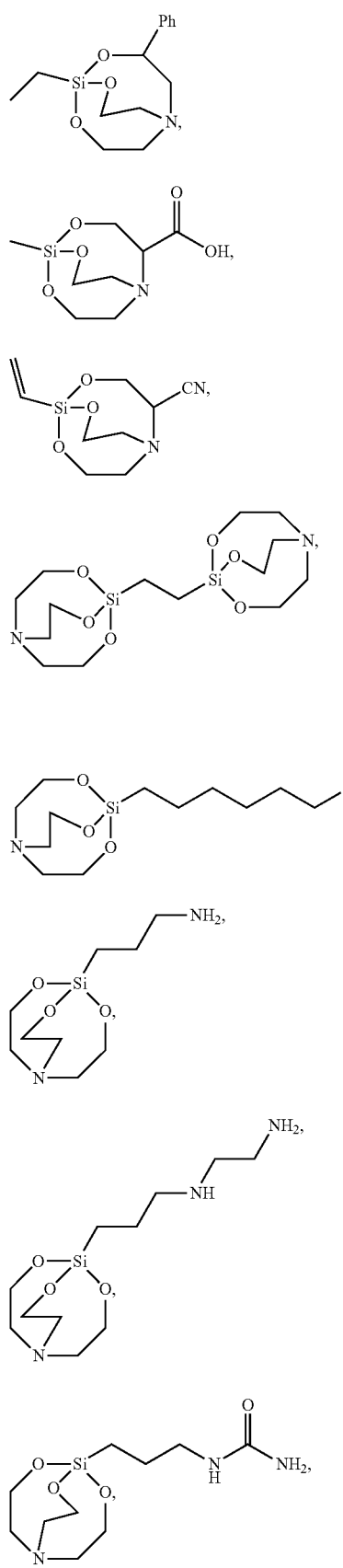
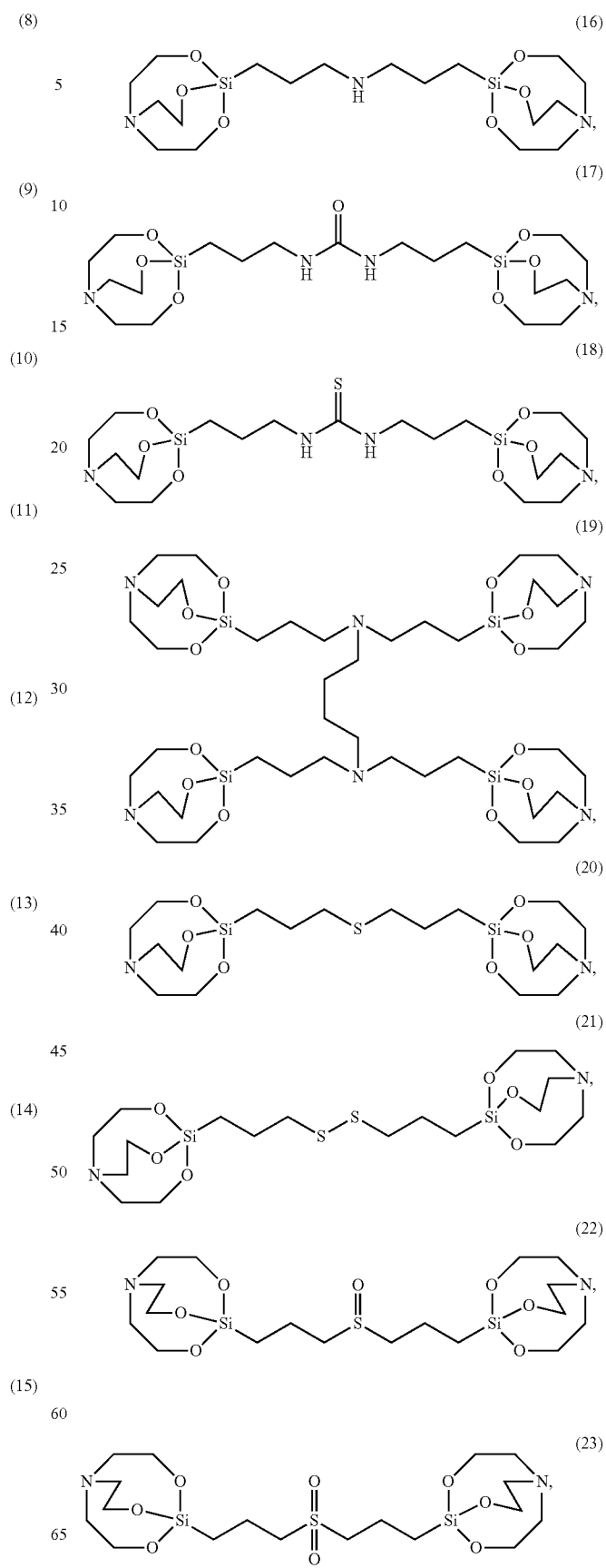

(24)
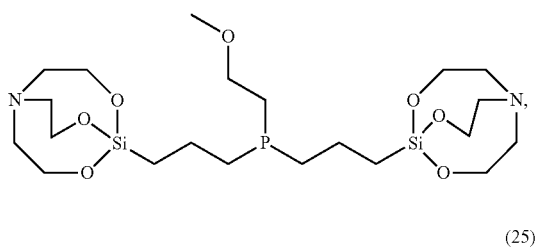

(25)
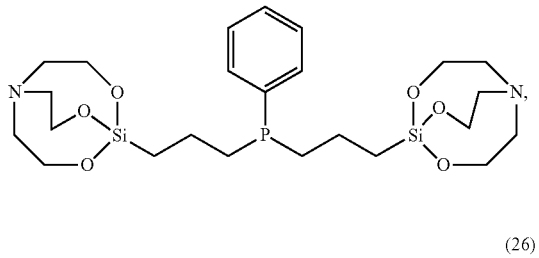

(26)
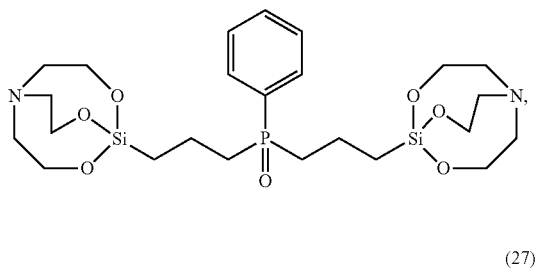

(27)
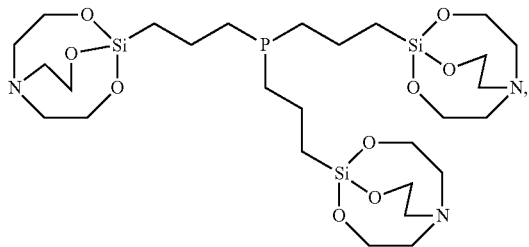

(28)
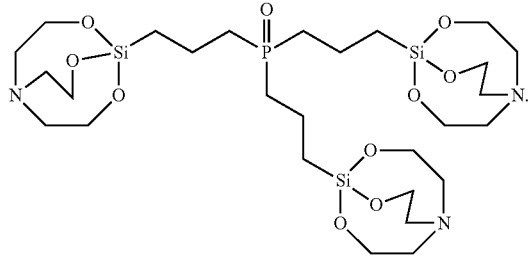

16. The etching composition of claim 1, wherein the phosphoric anhydride is at least one of water-removed pure phosphoric acid, pyrophosphoric acid, polyphosphoric acid having at least 3Ps and metaphosphoric acid.

17. The etching composition of claim 1, wherein the etching composition comprises the phosphoric acid in an amount of 70 wt % to 95 wt %, the phosphoric anhydride in an amount of 1 wt % to 20 wt %, the silane compound in an amount of 0.001 wt % to 5 wt %, and a remainder of water.

18. The etching composition of claim 1, further comprising a silane compound represented by the following Formula 2:

[Formula 2]

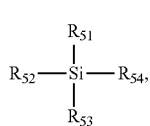

wherein $R^{51}$ to $R^{54}$ are independently hydrogen, hydrocarbyl, or heterohydrocarbyl, and $R^{51}$ to $R^{54}$ individually exist or two or more thereof form a ring, connected by a heteroelement.

19. A method of etching an insulating film using the etching composition of claim 1.

20. A method of manufacturing a semiconductor device comprising the method of etching an insulating film of claim 19.

* * * * *